(12) United States Patent
Hart

(10) Patent No.: US 8,519,483 B1
(45) Date of Patent: Aug. 27, 2013

(54) SEMICONDUCTOR DEVICE HAVING A HIGH RESISTANCE TO IONIZING RADIATION

(75) Inventor: Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 55 days.

(21) Appl. No.: 13/111,878

(22) Filed: May 19, 2011

(51) Int. Cl.
*H01L 27/092* (2006.01)
*H01L 21/70* (2006.01)
*H01L 21/8238* (2006.01)
*G11C 11/00* (2006.01)

(52) U.S. Cl.
USPC ........... 257/371; 257/368; 257/369; 257/509; 257/544; 365/154; 438/199

(58) Field of Classification Search
USPC ................. 257/368, 369, 394, 509, 544, 546, 257/371, E27.001; 365/182, 154; 327/566, 327/536; 438/128, 199, 218–221
See application file for complete search history.

(56) References Cited

U.S. PATENT DOCUMENTS

| | | | |
|---|---|---|---|
| 5,570,313 A | 10/1996 | Masson et al. | |
| 6,218,895 B1* | 4/2001 | De et al. | 327/566 |
| 7,079,413 B2* | 7/2006 | Tsukamoto et al. | 365/154 |
| 7,535,743 B2* | 5/2009 | Roche et al. | 365/63 |

* cited by examiner

*Primary Examiner* — Fernando L Toledo
*Assistant Examiner* — Aaron Gray
(74) *Attorney, Agent, or Firm* — LeRoy D. Maunu

(57) ABSTRACT

The semiconductor device includes a semiconductor substrate of a first type. A layer of semiconductor material of a second type is disposed on the semiconductor substrate. A first well and a second well are disposed on the layer. A third well is disposed on the layer between the first and second wells. A memory cell, including a first and a second plurality of transistors of the second type and a third plurality of transistors of the first type, is formed in the first, second, and third wells. The first plurality of transistors is formed in the first well, the second plurality of transistors is formed in the second well, and the third plurality of transistors is formed in the third well. The layer and the third well are configured to isolate the first and second wells from each other and from the semiconductor substrate.

13 Claims, 6 Drawing Sheets

SEMICONDUCTOR DEVICE HAVING A HIGH RESISTANCE TO IONIZING RADIATION

FIELD OF THE INVENTION

One or more embodiments generally relate to semiconductor memory, and more particularly to static random access memory.

BACKGROUND

Static Random Access Memory (SRAM) is a type of semiconductor memory that uses bi-stable latching circuitry to store each bit. SRAM provides data storage in many electronic devices and is often used to implement programmable logic integrated circuits (ICs). Programmable logic ICs, such as field programmable gate arrays (FPGAs), are user configurable and capable of implementing digital logic operations.

The versatility of programmable ICs is advantageous in applications in which remote reconfiguration is preferred over physical replacement. However, many applications expose components to environments where radiation from cosmic or terrestrial sources is present and can cause an error in an SRAM cell. These types of errors are referred to as single event upsets (SEUs). A radiation environment contains charged particles that interact with silicon atoms. When a single heavy ion strikes a silicon substrate, it loses energy through the creation of electron-hole pairs. This results in a dense ionized track in the local region, generating a current pulse that can upset the circuit. This is known as a single upset event (SEU) or soft error. An SEU can also be caused by alpha particles. Alpha particles are generated when a neutron strikes a silicon substrate. The alpha particles travel through the substrate and generate charge clusters within a limited silicon volume. Alpha particles can be generated from high-energy neutrons as well as neutrons that have lost enough kinetic energy to be at thermal equilibrium with the operating environment. Alpha particles can also be generated through the decay of semiconductor packages which contain a small amount of radioactive isotopes.

In some circuits, an SEU only has a transient effect following the particle strike and the variation may disappear in a time depending on the logic delay of the circuit. However, in circuits containing SRAM, an SEU occurring in an SRAM cell may cause the cell to change state. When a particle hits a memory cell, the resulting current pulse can trigger a transistor of the memory cell to pass current, thereby creating a momentary change in state on one of the memory cell nodes. As a result of the momentary change, a stored state of the memory cell can be inverted or "flipped." For example, output Q could change from logic "1" to logic "0" and the output Q-bar could change from logic "0" to logic "1". In programmable logic circuits, which include memory cells whose stored values determine the function of each logic block, an SEU can change the function of the programmed logic. Depending on the particular memory cell affected, the upset may cause the circuit to operate improperly until the programmable logic is reconfigured.

SUMMARY

In one embodiment, a semiconductor device is provided. The device includes a semiconductor substrate of a first type. A layer of semiconductor material of a second type is disposed on the semiconductor substrate. A first well and a second well of the first type are disposed on the layer. A third well of the second type is disposed on the layer between the first and second wells. A memory cell, including a first and a second plurality of transistors of the second type and a third plurality of transistors of the first type, is formed in the first, second, and third wells. The first plurality of transistors is formed in the first well, the second plurality of transistors is formed in the second well, and the third plurality of transistors is formed in the third well. The layer of the second type and the third well are configured to isolate the first and second wells from each other and from the semiconductor substrate.

In another embodiment, a semiconductor device is provided. The device includes a semiconductor substrate of a first type. A layer of semiconductor material of a second type is disposed on the semiconductor substrate. A first well and a second well of the first type are disposed on the layer. A third well of the second type is disposed on the layer between the first and second wells. A first one of a pair of redundant latches including a first plurality of transistors of the first and second types is formed. Each transistor of the first type of the first redundant latch is formed in the third well, and each transistor of the second type of the first redundant latch is formed in the first well. A second one of the pair of redundant latches including a second plurality of transistors of the first and second types is formed. Each transistor of the first type of the second one of the pair of redundant latches is formed in the third well. Each transistor of the second type of the second one of the pair of redundant latches is formed in the second well. The layer of the second type and the third well are configured to isolate the first and second wells from each other and from the semiconductor substrate.

In yet another embodiment, a method of manufacturing a semiconductor device is provided. A semiconductor substrate of a first type is provided. A layer of a second type is implanted within the semiconductor substrate. A first and a second well of the first type and a third well of the second type are formed. The third well of the second type extends to the layer and separates the first and second wells. A first plurality of transistors of the second type is formed in the first well, a second plurality of transistors of the second type is formed in the second well, and a third plurality of transistors of the first type is formed in the third well. At least one patterned conductive layer that interconnects the first, second, and third pluralities of transistors to form a memory cell is deposited.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION

Static Random Access Memory (SRAM) is a type of semiconductor memory that uses bi-stable latching circuitry to store each bit. A typical SRAM cell includes two pull-up and two pull-down transistors arranged as cross linked latches to maintain two stable states, which represent the value 0 or 1 of a stored bit. While operating, radiation in the form of charged particles created by incoming neutrons or heavy ions may interact with silicon atoms of the transistors to upset the stable state of the circuit. When a charged particle strikes a silicon substrate of a semiconductor, the ion loses energy through the creation of free electron hole pairs. This results in a dense ionized track in the local region. If the ion strikes a depletion region of an 'off' state transistor (i.e., transistor drain-to-source channel in high resistance state) of the SRAM cell, the transistor may be momentarily shorted (i.e., transistor drain to source channel becomes low resistance), which can lead to the SRAM cell switching to the other stable state. However, the effect of ions is generally limited to a local area where the strike occurs. It is unlikely that resulting electron hole pairs would be generated in a neighboring well region of the semiconductor, outside the region of the charged ion path.

Figure 1:
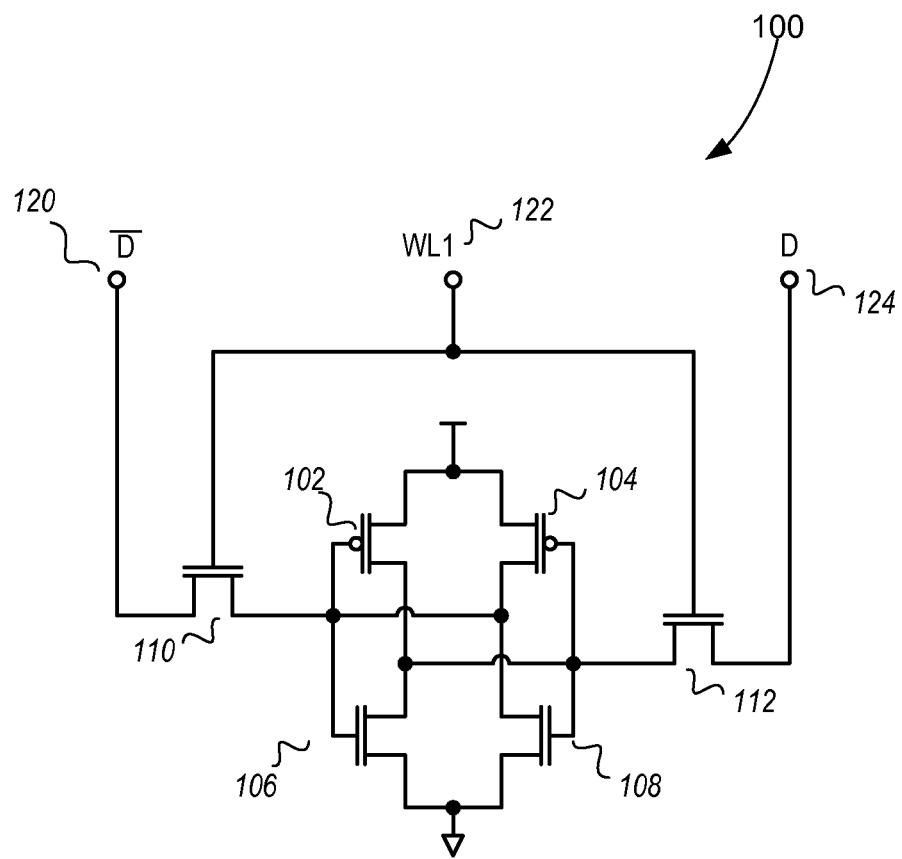
FIG. 1 is a circuit diagram of a memory semiconductor device having a six transistor architecture.

FIG. 1 shows a typical six transistor (6T) SRAM cell. The cell 100 includes a first inverter that is implemented with transistors 102 and 106 and cross-coupled with a second inverter, which is implemented with transistors 104 and 108. The inverted output of a first inverter is used as input to a second inverter. The second inverter reverts the inverted output of the first inverter to the original value and is used to maintain the inverters in a constant state once input is removed. In this manner, a bit can be stored in the circuit. In addition to the cross-coupled inverter arrangement, two or more additional access transistors serve to control the access to a storage cell during read and write operations. Transistors 110 and 112 are respectively coupled to signal lines 120 and 124 to control read/write access to the cell. During a read or write of the cell, transistors 110 and 112 are enabled by write line 122. Signal line 120 is set to an inverted complement of signal line 124. Although it is not strictly necessary to have two signal lines, both the signal and its inverse are typically provided in order to improve noise margins. Signal lines are also referred to as bit-lines and such terms are used interchangeably herein.

Figure 2:
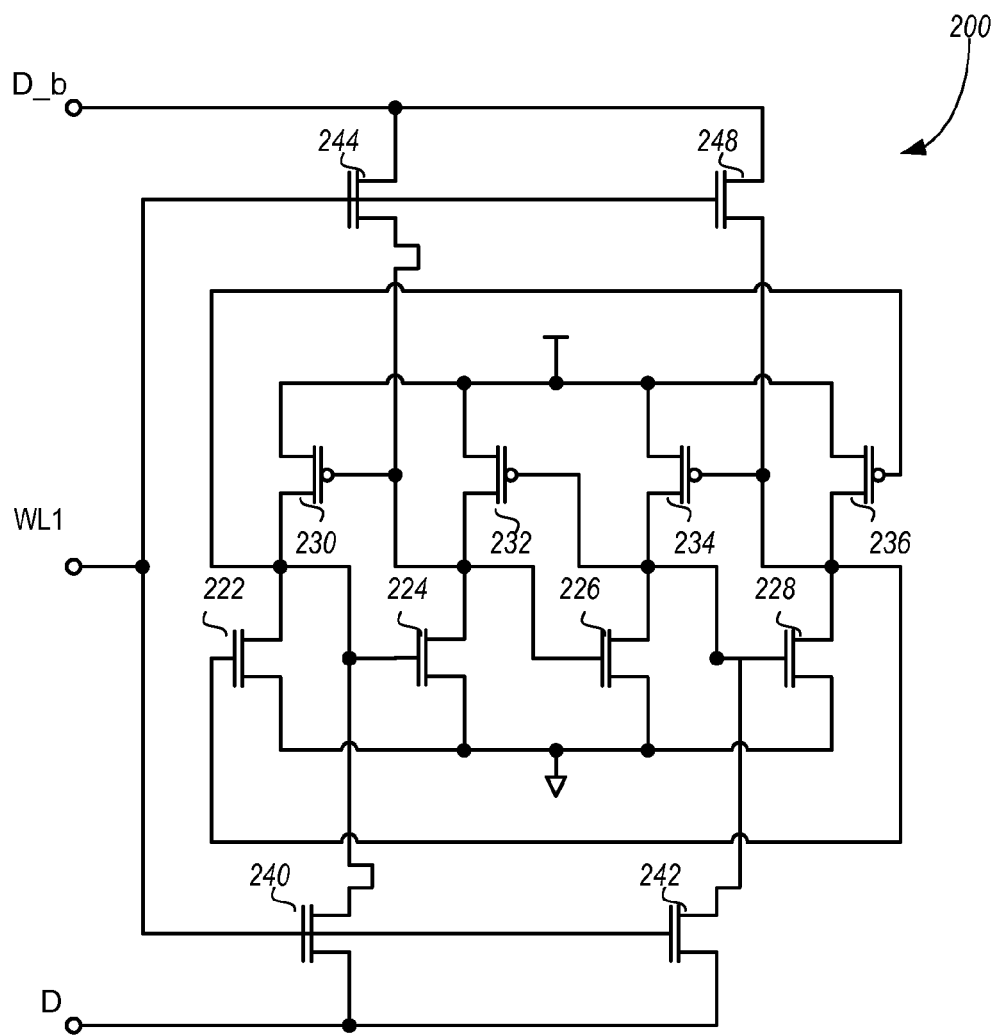
FIG. 2 is a circuit diagram of a twelve transistor memory semiconductor device having redundant latches which exhibit a high resistance to ionizing radiation.

In one or more embodiments, the resistance to SEUs in SRAM cells is increased by implementing the SRAM cell with redundant latches. FIG. 2 shows a 12 transistor (12T) SRAM cell 200 which implements the 6T SRAM cell of FIG. 1 with redundant latches. The 12T SRAM cell implements two pairs of redundant latches. The first pair of latches are implemented with pull-up transistors 232 and 236 and pull-down transistors 224 and 228. The second pair of latches are implemented with pull-up transistors 230 and 234 and pull-down transistors 222 and 226. During a read or write of the cell, transistors 240, 242, 244, and 248 are enabled by write enable signal WL1. U.S. Pat. No. 5,570,313 further describes a 12T memory cell.

The likelihood of an incident particle causing simultaneous disturbance of the redundant latches may be much lower than for conventional 6T single latch SRAM cells. In one or more embodiments, deep-well isolation techniques are used to laterally isolate the redundant latches from each other—further reducing the possibility for SEU events disturbing both latches. For example, in one or more embodiments the 12T SRAM cell shown in FIG. 2 is implemented with a semiconductor layout that places the NMOS pull-down latches and access MOSFETs of the component latches in isolated P-type wells with an intervening N-type well region (implementing PMOS pull-up MOSFET's) isolating the P-type wells from each other.

Under certain circumstances, charges deposited in the substrate below the 12T cell may simultaneously upset redundant latches. For example, charge may transfer between a P substrate and P-well of an NMOS transistor. One or more embodiments prevent charge transfer through the substrate by forming an N-type region or layer below the SRAM cell, isolating the P-type well of the component latches from the P-type substrate.

Figure 3:
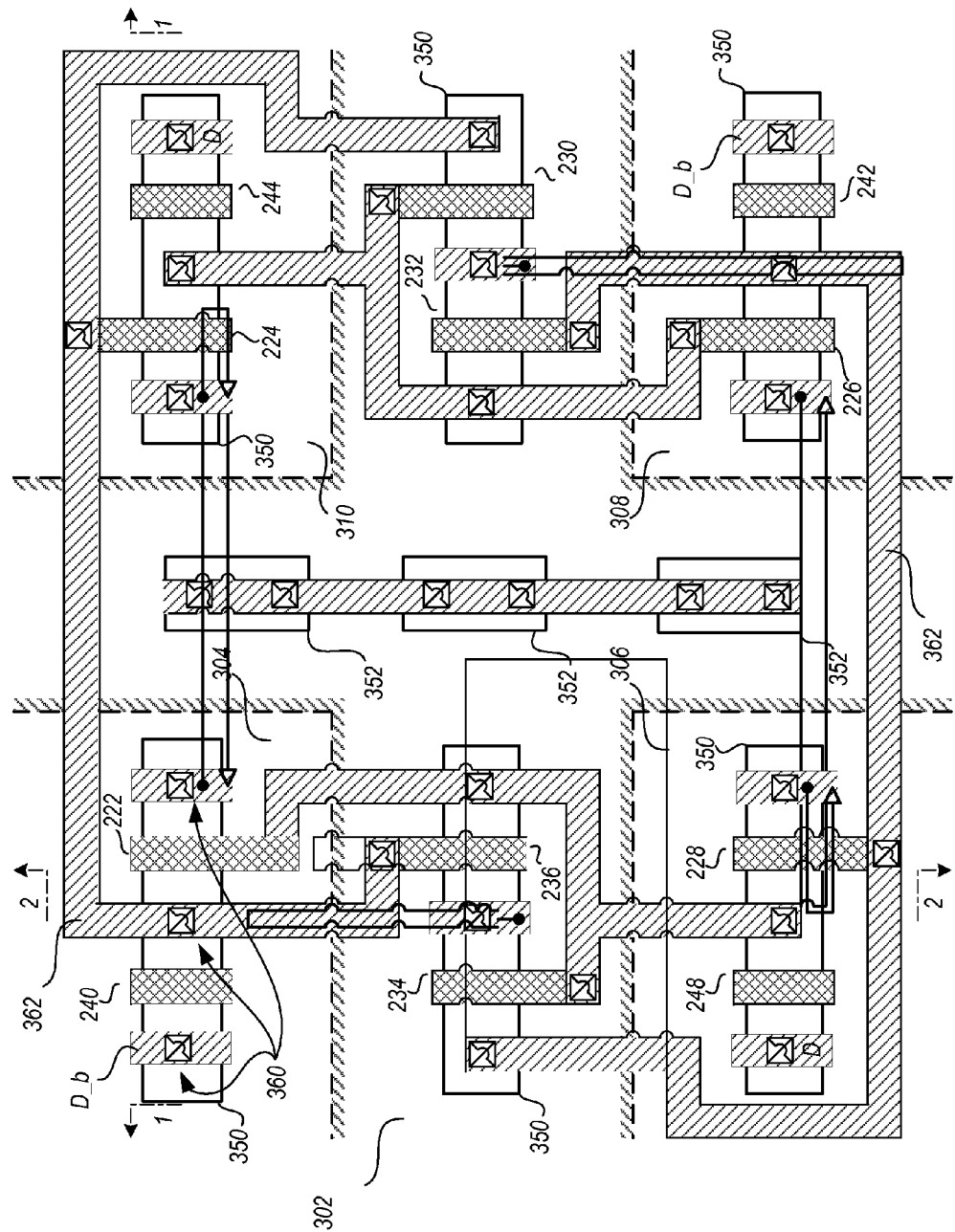
FIG. 3 is a layout diagram of a memory semiconductor device having the twelve transistor architecture shown in FIG. 2.
Figure 4:
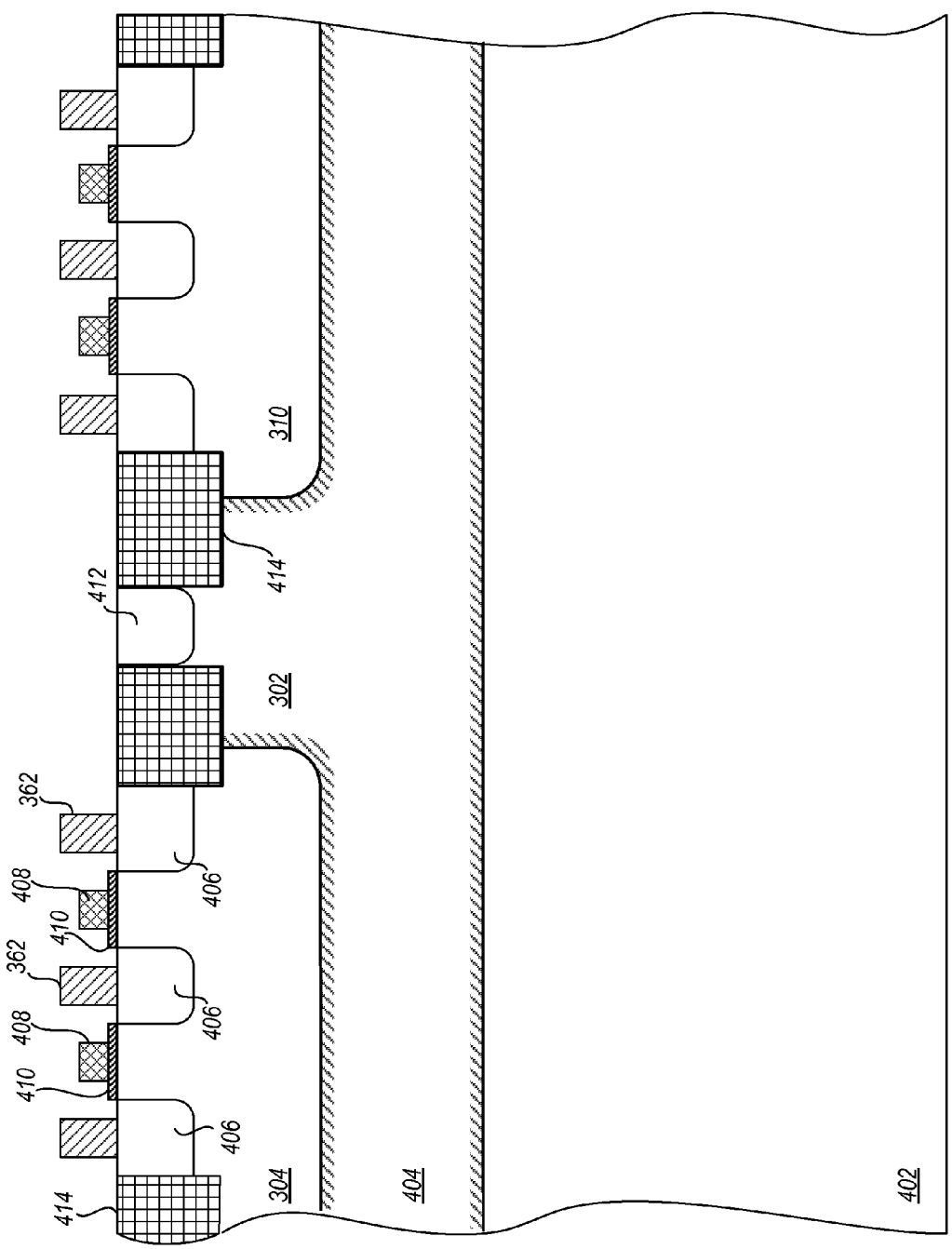
FIG. 4 is a cross-section through the layout diagram of FIG. 3 along the section line 1.
Figure 5:
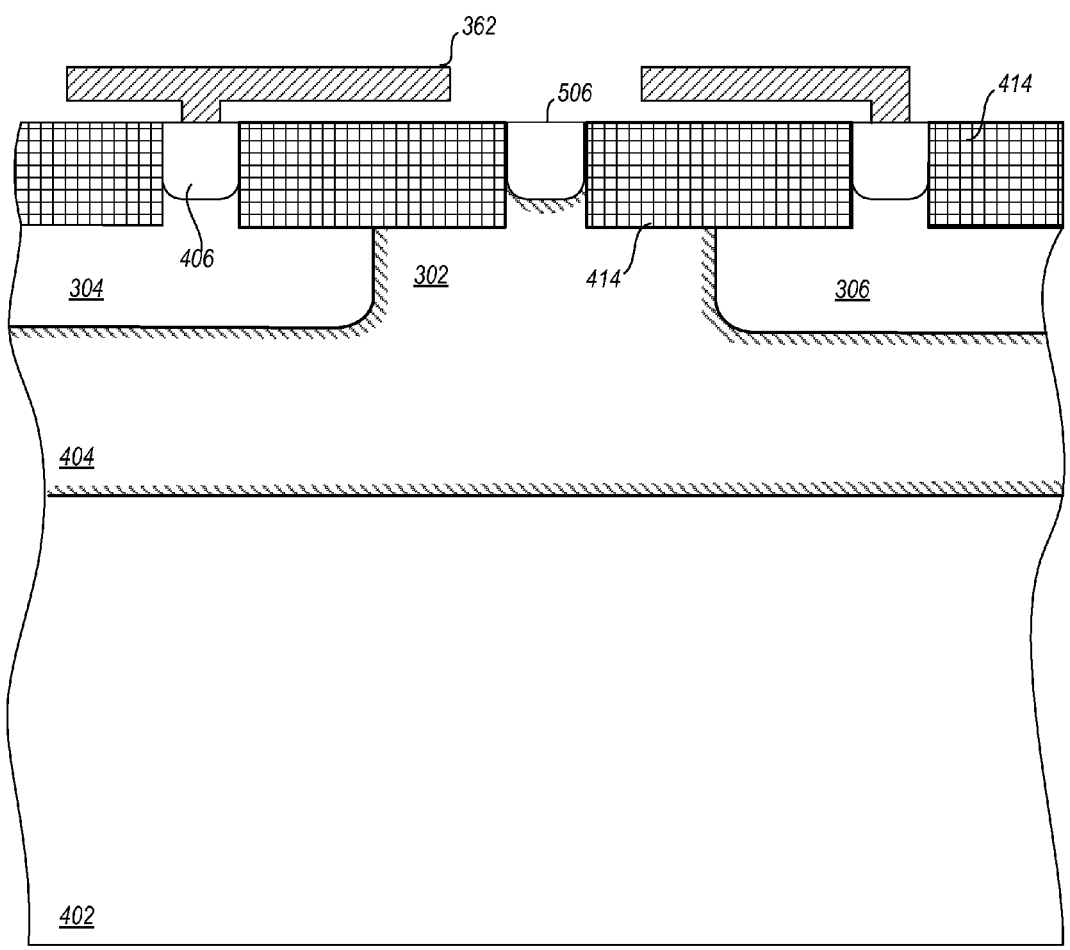
FIG. 5 is a cross-section through the layout diagram of FIG. 3 along the section line 2.

FIGS. 3, 4, and 5 show an example layout of the 12T SRAM cell semiconductor shown in FIG. 2, with redundant NMOS transistors implemented in separate isolated P-type wells. FIG. 3 shows a top view of the semiconductor layout. An N-type semiconductor well 302 is included for implementing PMOS pull-up transistors. The N-type semiconductor well 302 is located to laterally isolate P-type wells 304, 306, 308, and 310 from each other. NMOS pull-down transistors 222, 224, 226, and 228 and write-line enable NMOS transistors 240, 242, 244, and 248 are implemented in the P-type wells, placing redundant transistors in different ones of the P-type wells. Each transistor includes a gate region and two source/drain regions (not shown). Diffusion areas of the transistors in each well are shown by regions 350. Source/drain regions (not shown) are located on the sides of each gate region within diffusion regions 350. Metal wire source/drain contacts 360 are shown formed over source/drain regions. Source/drain regions may be shared between two transistors. For example, transistor 240 shares one source/drain region with transistor 222. Poly-silicon signal lines (shown with cross hatched shading) and metalized signal lines 362 (shown with diagonal shading) are formed on the transistors to connect various source/drain and gate contacts of the transistors. The source/drain and gate electrodes of the transistors are arranged, using the metalized and poly-silicon signal lines, to form the 12T SRAM cell shown in FIG. 2.

A central portion of the N-type well 302 contains a number of N-Taps having diffusion regions 352 and coupled together with metalized signal lines. Since the P-type wells 304, 306, 308, and 310 are isolated from each other, an SEU striking a transistor in one of the P-type wells is not likely to result in an SEU in the other P-type well.

FIG. 4 shows cross-section 1 of FIG. 3. For ease of illustration, FIG. 4 is not to scale relative to FIG. 3. The cross section shows each of the three semi-conductor wells 304, 302, and 310 formed on semiconductor substrate 402. As used within the specification and the claims, the term "on" includes when items (e.g., layers, wells, or substrate) are in physical contact and when the items are separated by one or more intervening items. A deep N-type well layer 404 is formed in the substrate to isolate the substrate from wells 304, 302, and 310 of the SRAM cell. In the P-type wells 304 and 310, N-type source/drain regions 406 are formed. MOSFET gates 408 and corresponding dielectric layers 410 are formed between the source/drain regions 406. N-type tap contact 412 is also formed in N-type well 302 to also control diffusion in this region.

The N-type well 302 extends down to N-type layer 404. The N-type regions 302 and 404 provide reverse-biased p-n junctions that electrically separate the two P-type wells 304 and 310 from each other and that electrically separate each of the P-type wells from the P-type semiconductor substrate 402. When ionizing radiation generates a track of electron hole pairs in the semiconductor substrate, the electrons and the holes cannot easily transfer to the P-type wells 304 and 310. In this manner occurrences of SEUs are reduced. As illustrated in FIG. 4, in some embodiments, a layer of shallow trench oxide 414 may be formed around the diffusion regions 350 shown in FIG. 3 to further isolate diffusion regions of the transistors in the P-wells.

FIG. 5 is a cross-section through the layout diagram of FIG. 3 along the cross section line 2. For ease of illustration, FIG. 5 is not to scale relative to FIG. 3. This cross section shows semiconductor wells 302, 304, and 306 formed on semiconductor substrate 402. As discussed with reference to FIG. 4, deep N-type well layer 404 is formed in the substrate to isolate the substrate from wells 304, 302, and 306 of the SRAM cell. In the P-type wells 304 and 306, N-type source/drain regions 406 are formed to implement NMOS transistors. In the N-type well 302, P-type source/drain regions 506 are formed. As discussed with reference to FIG. 4, in some embodiments, a layer of shallow trench oxide 414 may be formed around diffusion regions 350. As discussed above, the N-type region 302 and N-type layer 404 provide reverse-biased p-n junctions that electrically separate the two P-type wells 304 and 310 from each other and from the substrate 402.

As an alternative to the deep N-well layer 404 shown in FIGS. 4 and 5, one or more embodiments may use other structures to form a reverse biased PN junctions for isolation. For example, rather than a continuous layer of N-type material, each P-type well may be formed in an N-type well to isolate the P-type well from the P-type substrate. The N-type well material surrounding each P-type well acts to form a reverse biased PN junction similar to that formed by the N-type layer. In some embodiments, rather than forming PN junctions, isolation may be facilitated using dielectrics or other insulators. For example, in implementations where P-wells are embedded or epitaxially grown materials, dielectric insulators such as silicon oxide may be used to form an insulator around the well-regions.

Figure 6:
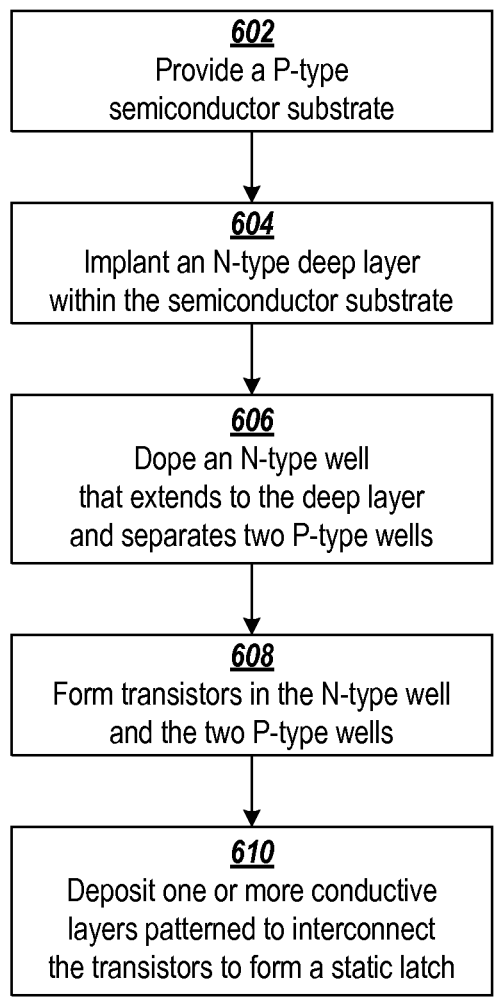
FIG. 6 is a flow diagram of a process of manufacturing a semiconductor device having a high resistance to ionizing radiation.

FIG. 6 is a flow diagram of a process of manufacturing a semiconductor device having a high resistance to ionizing radiation. A P-type semiconductor substrate is provided at process block 602. An N-type deep layer is deposited within the semiconductor substrate at block 604. In one implementation, the deep N-type layer may be formed using deep ion implantation. The deeply implanted donor ions penetrate through a surface volume of the P-type semiconductor, and after annealing, the donor ions create a buried N-type region that separates the P-type surface volume from the bulk of the p-type semiconductor substrate. In another embodiment, the deep N-type layer may be formed through epitaxial deposition.

An N-type well, extending to the deep layer and separating two P-wells is doped at process block 606. Transistors are formed in the N-type well and two P-wells at block 608. As discussed above, various volumes of N-type semiconductor material isolate the two P-type wells from each other and form the P-type semiconductor substrate. This limits the propagation of electrons and holes within the memory semiconductor device and increases resistance to ionizing radiation as discussed below. One or more conductive layers are patterned to interconnect the transistors into an SRAM cell at block 610.

The embodiments and examples included herein above describe the SRAM cells in terms of cross-coupled inverters formed from a PMOS pull-up transistor and a NMOS pull-down transistor. It is also recognized that SRAM cells can be implemented using inverter circuits of various configurations using a wide variety of transistor types. One skilled in the art will recognize that transistors of other inverter and SRAM configurations can be similarly implemented with redundant transistors that are isolated from each other as described in the above embodiments.

The embodiments are thought to be applicable to a variety of SRAM cell applications. Other aspects and embodiments will be apparent to those skilled in the art from consideration of the specification and practice of the invention disclosed herein. It is intended that the specification and illustrated embodiments be considered as examples only, with a true scope and spirit of the embodiments being indicated by the following claims.

What is claimed is:

1. A semiconductor device, comprising:
a semiconductor substrate of a first type;
a layer of a second type disposed on the semiconductor substrate;
first, second, third, and fourth wells of the first type disposed on the layer;
a fifth well of the second type disposed on the layer between the first, second, third, and fourth wells, the layer and the fifth well being configured to isolate the first, second, third, and fourth wells from each other and from the semiconductor substrate; and
a memory cell including a plurality of pull-down transistors, a plurality of pull-up transistors, and a plurality of write-enable transistors, wherein the pull-down transistors and the write-enable transistors are formed in the first, second, third, and fourth wells, and the pull-up transistors are formed in the fifth well.

2. The semiconductor device of claim 1, further comprising shallow trench isolation regions surrounding the pull-down transistors, the write-enable transistors, and the pull-up transistors for further isolating the first, second, third, fourth, and fifth wells from each other and from the semiconductor substrate.

3. The semiconductor device of claim 2, wherein the memory cell includes 4 pull-up transistors, 4 pull-up transistors, and 4 write-enable transistors.

4. A semiconductor device, comprising:
a semiconductor substrate of a first type;
a region of a second type disposed on the semiconductor substrate;
first, second, third, and fourth wells of the first type disposed on the region of the second type;
a fifth well of the second type disposed in the region between the first, second, third, and fourth wells, the region of the second type and the fifth well being configured to isolate the first, second, third and fourth wells from each other and from the semiconductor substrate;
a first redundant latch including first and second pull-down transistors, first and second pull-up transistors, and first and second write-enable transistors, wherein the first and second pull-down transistors and the first and second write-enable transistors are formed in the first and second wells, respectively, and the first and second pull-up transistors are formed in the fifth well; and
a second redundant latch including third and fourth pull-down transistors, third and fourth pull-up transistors, and third and fourth write-enable transistors, wherein the third and fourth pull-down transistors and the third and fourth write-enable transistors are formed in the third and fourth wells, respectively, and the third and fourth pull-up transistors are formed in the fifth well.

5. The semiconductor of claim 4, wherein the region of the second type is a semiconductor layer disposed on the semiconductor substrate.

6. The semiconductor of claim 4, wherein:
the region of the second type includes at least one well region of the second type disposed in the semiconductor substrate; and
at least one of the first, second, third, or fourth wells are disposed in the at least one well region of the second type.

7. The semiconductor of claim 4, wherein the region of the second type isolates the first, second, third, and fourth wells from each other and from the semiconductor substrate by forming a reversed biased pn junction.

8. The semiconductor device of claim 4, further comprising shallow trench isolation regions surrounding the first pull-down transistor and the first write-enable transistor, the second pull-down transistor and the second write-enable transistor, the third pull-down transistor and the third write-enable transistor, the fourth pull-down transistor and the fourth write-enable transistor, the first and second pull-up transistors, and the third and fourth pull-up transistors, respectively, for further isolating the first and second wells from each other and from the semiconductor substrate.

9. The semiconductor device of claim 7, wherein the first type is p-type and the second type is n-type.

10. A method of manufacturing a semiconductor device, comprising:
providing a semiconductor substrate of a first type;
implanting a layer of a second type within the semiconductor substrate;
forming first, second, third, and fourth wells of the first type and a fifth well of the second type, including doping the fifth well of the second type that extends to the layer and separates the first, second, third, and fourth wells;
forming a first plurality of transistors of the second type in the first, second, third, and fourth wells, and a second plurality of transistors of the first type in the fifth well; and
depositing at least one patterned conductive layer that interconnects the first, and second pluralities of transistors to form a memory cell.

11. The method of claim 10, wherein the forming of the first, second, third, fourth, and fifth wells includes doping the first, second, third, and fourth wells of the first type.

12. The method of claim 10, wherein the depositing of the at least one patterned conductive layer includes interconnecting the first and second pluralities of transistors to form a redundant pair of latches.

13. The method of claim 12, wherein depositing includes forming a 12 transistor redundant pair of latches.

\* \* \* \* \*